United States Patent
Van Selow

(10) Patent No.: US 10,971,384 B2
(45) Date of Patent: Apr. 6, 2021

(54) AUTO-CALIBRATED PROCESS INDEPENDENT FEEDFORWARD CONTROL FOR PROCESSING SUBSTRATES

(71) Applicant: LAM RESEARCH CORPORATION, Fremont, CA (US)

(72) Inventor: Anthony Paul Van Selow, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 191 days.

(21) Appl. No.: 16/130,454

(22) Filed: Sep. 13, 2018

(65) Prior Publication Data

US 2020/0090968 A1    Mar. 19, 2020

(51) Int. Cl.
| | | |
|---|---|---|
| H01L 21/67 | (2006.01) | |
| G05B 19/418 | (2006.01) | |
| C23C 16/52 | (2006.01) | |

(52) U.S. Cl.
CPC ........ *H01L 21/67253* (2013.01); *C23C 16/52* (2013.01); *G05B 19/41865* (2013.01); *H01L 21/67063* (2013.01); *H01L 21/67248* (2013.01); *G05B 2219/45031* (2013.01)

(58) Field of Classification Search
None
See application file for complete search history.

(56) References Cited

U.S. PATENT DOCUMENTS

| | | | | |
|---|---|---|---|---|
| 2006/0087632 | A1* | 4/2006 | Tousain | G03B 27/42 355/53 |
| 2006/0187713 | A1* | 8/2006 | Weetman | G05B 19/4183 365/185.22 |
| 2012/0031892 | A1* | 2/2012 | Shigetomi | H01L 21/67248 219/444.1 |
| 2015/0226611 | A1* | 8/2015 | Busche | H01L 21/67103 374/121 |
| 2015/0355120 | A1* | 12/2015 | Deutsher | G01K 13/00 374/5 |

* cited by examiner

*Primary Examiner* — Bernard G Lindsay

(57) ABSTRACT

A substrate processing system to process a substrate includes a sensor to generate sensed values of a parameter of the substrate processing system. An actuator adjusts the parameter of the substrate processing system. A controller communicates with the sensor and the actuator and is configured to process a first substrate using the sensed values to adjust control values for controlling the actuator without feedforward control during a process. The sensed values are delayed and cause instability in the parameter. The controller is further configured to automatically calibrate feedforward values for processing a second substrate based on the sensed values and the control values and process the second substrate while controlling the actuator using the feedforward values.

25 Claims, 7 Drawing Sheets

AUTO-CALIBRATED PROCESS INDEPENDENT FEEDFORWARD CONTROL FOR PROCESSING SUBSTRATES

FIELD

The present disclosure relates to substrate processing systems and more particularly to an auto-calibrated feedforward control system for a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, cleaning, and/or other treatment of substrates such as semiconductor wafers. During processing, a substrate is arranged on a substrate support, such as a pedestal, an electrostatic chuck (ESC), etc. in a processing chamber of the substrate processing system. A process gas mixture is introduced into the processing chamber to treat the substrate. In some examples, plasma may be struck to enhance chemical reactions within the processing chamber. An RF bias may be supplied to the substrate support to control ion energy.

A controller that is used to run the process may receive feedback values relating to chamber parameters from one or more sensors. For example, the controller may receive feedback values from one or more temperature or pressure sensors. The controller makes adjustments to the process based on a recipe and controls the actuator based on the feedback values from the sensors. Examples of actuators include heaters, valves, RF generators, pumps, etc. In some examples, the feedback values provided by the sensors may be delayed. As a result, the controller is unable to adjust the actuator in time to avoid departure from a desired operating state.

While feedforward control can be used, it can be difficult to implement. The feedforward values are manually determined and tested for each process step and for each process. For example, feedforward values for each new or modified recipe may take on the order of a day of work to determine.

Alternately, higher cost sensors may be used to sense the chamber parameter in real time. For example, an optical sensor can be used to measure the pedestal temperature without a delay. However, optical sensors and their supporting electronics are expensive. Furthermore if the optical sensors are used, the temperature sensor is also typically still required for redundancy.

SUMMARY

A substrate processing system to process a substrate includes a sensor to generate sensed values of a parameter of the substrate processing system. An actuator adjusts the parameter of the substrate processing system. A controller communicates with the sensor and the actuator and is configured to process a first substrate using the sensed values to adjust control values for controlling the actuator without feedforward control during a process. The sensed values are delayed and cause instability in the parameter. The controller is further configured to automatically calibrate feedforward values for processing a second substrate based on the sensed values and the control values; and process the second substrate while controlling the actuator using the feedforward values.

In other features, to automatically calibrate the feedforward values, the controller is further configured to time-shift the sensed values by a delay period to generate time-shifted sensed values; determine changes in the time-shifted sensed values during a plurality of steps of the process; determine durations of the plurality of steps of the process; determine the feedforward values for the plurality of steps of the process based on the control values for the actuator, the change in the sensed values during a corresponding one of the plurality of steps and the duration of the corresponding one of the plurality of steps of the process; and process the second substrate based on the feedforward values.

In other features, the delay period is longer than 5 seconds. The controller is further configured to perform data smoothing on the sensed values from the sensor. The controller is further configured to perform interpolation to match timestamps for the sensed values and the control values. The controller is further configured to determine average values for the control values during the plurality of steps of the process. The controller is further configured to determine the feedforward values for the plurality of steps of the process based on the average values, the changes in the sensed values during the plurality of steps of the process, and the duration of the plurality of steps of the process.

In other features, the feedforward values for the second substrate are calculated based on $DC_{avg} - FF\_Constant*(\Delta T/\Delta S)$ wherein $DC_{avg}$ corresponds to the average values, $\Delta T$ corresponds to the changes in the sensed values during the plurality of steps of the process, $\Delta S$ corresponds to the duration of the plurality of steps of the process, and $FF\_Constant$ corresponds to a scaling factor. The feedforward values for a third substrate are calculated based on $DC_{avg} - FF\_Constant/K*(\Delta T/\Delta S)$ wherein $DC_{avg}$ corresponds to the average values, $\Delta T$ corresponds to the changes in the sensed values during the plurality of steps of the process, $\Delta S$ corresponds to the duration of the plurality of steps of the process, $FF\_Constant$ corresponds to a scaling factor, and $K$ is a calibration reducing factor.

In other features, the sensor includes a temperature sensor. The actuator includes a heater for a substrate support of the substrate processing system. The control values include duty cycle values. The substrate processing system performs at least one of deposition and etching.

A method for processing a substrate in a substrate processing system includes generating sensed values of a parameter of the substrate processing system; adjusting the parameter of the substrate processing system; processing a first substrate using the sensed values to adjust control values for controlling an actuator without feedforward control during a process. The sensed values are delayed and cause instability in the parameter. The method further includes automatically calibrating feedforward values for processing a second substrate based on the sensed values and the control values; and processing the second substrate while controlling the actuator using the feedforward values.

In other features, automatically calibrating the feedforward values includes time-shifting the sensed values by a delay period to generate time-shifted sensed values; determining changes in the time-shifted sensed values during a plurality of steps of the process; determining durations of the plurality of steps of the process; determining the feedforward values for the plurality of steps of the process based on the control values for the actuator, the change in the sensed values during a corresponding one of the plurality of steps and the duration of the corresponding one of the plurality of steps of the process; and processing the second substrate based on the feedforward values.

In other features, the method includes performing data smoothing on the sensed values from the sensor. The method includes performing interpolation to match timestamps for the sensed values and the control values. The method includes determining average values for the control values during the plurality of steps of the process.

In other features, the method includes determining the feedforward values for the plurality of steps of the process based on the average values, the changes in the sensed values during the plurality of steps of the process, and the duration of the plurality of steps of the process. The method includes calculating the feedforward values for the second substrate based on DCavg−FF_Constant*(ΔT/ΔS) wherein DCavg corresponds to the average values, ΔT corresponds to the changes in the sensed values during the plurality of steps of the process, ΔS corresponds to the duration of the plurality of steps of the process, and FF_Constant corresponds to a scaling factor.

In other features, the control values include duty cycle values. The method include performing at least one of etching and deposition using the substrate processing system.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Substrate processing systems use sensors to measure chamber parameters such as temperature, pressure, flow rate, or other values. In some situations, sensed values generated by the sensors may be delayed significantly relative to real-time. Depending on the magnitude of the disturbance and the length of the delay, instability may occur.

For example, a temperature sensor used in a bevel etcher may have a long thermal delay that causes thermal instability. For example, instability may occur in some systems when the delay is greater than 5, 10, 15 or 20 seconds. For example, some systems such as the bevel etcher described herein have a thermal delay of approximately 50-55 seconds.

Feedforward control techniques may be used for systems with long feedback delays. For example, feedforward control may be used to input heat energy into the system to counteract a cooling disturbance as it occurs and before the cooling can be measured. However, feedforward control can be very complex to implement since a model of all of the disturbances is required. This, in turn, requires testing to be performed to determine feedforward values for each step of a recipe. Changes to the recipe require re-testing. As a result, feedforward control has generally not been favorably received by customers.

In some processes, pressure may be increased during one or more steps of a recipe. The increase in pressure cools the pedestal and the substrate. Due to thermal delay, the temperature sensor does not sense the cooling quickly enough to compensate by heating the substrate support and temperature instability occurs. Systems and methods according to the present disclosure automate the process of determining feedforward values for an actuator in a substrate processing system. As a result, control of the actuator can be adjusted by an experimentally determined amount while maintaining closed loop proportional, integral, derivative (PID) control. By the time changes are detected by the temperature sensor, there is a very small disturbance in the chamber parameter since compensation was already performed as the disturbance occurred.

Systems and methods according to the present disclosure automatically select feedforward values for each step of a process after one iteration of the process without modeling or testing. The systems and methods continue to refine the feedforward values until a desired level of control is achieved.

While the forgoing description provides specific details relating to temperature control of a heater in a substrate support of a bevel etcher, the principles described herein can also be used to control other types of actuators in a feedforward manner. In addition, the principles described herein can be used for other types of substrate processing systems performing chemical vapor deposition (CVD), atomic layer deposition (ALD) or other types of substrate processing.

Figure 1:
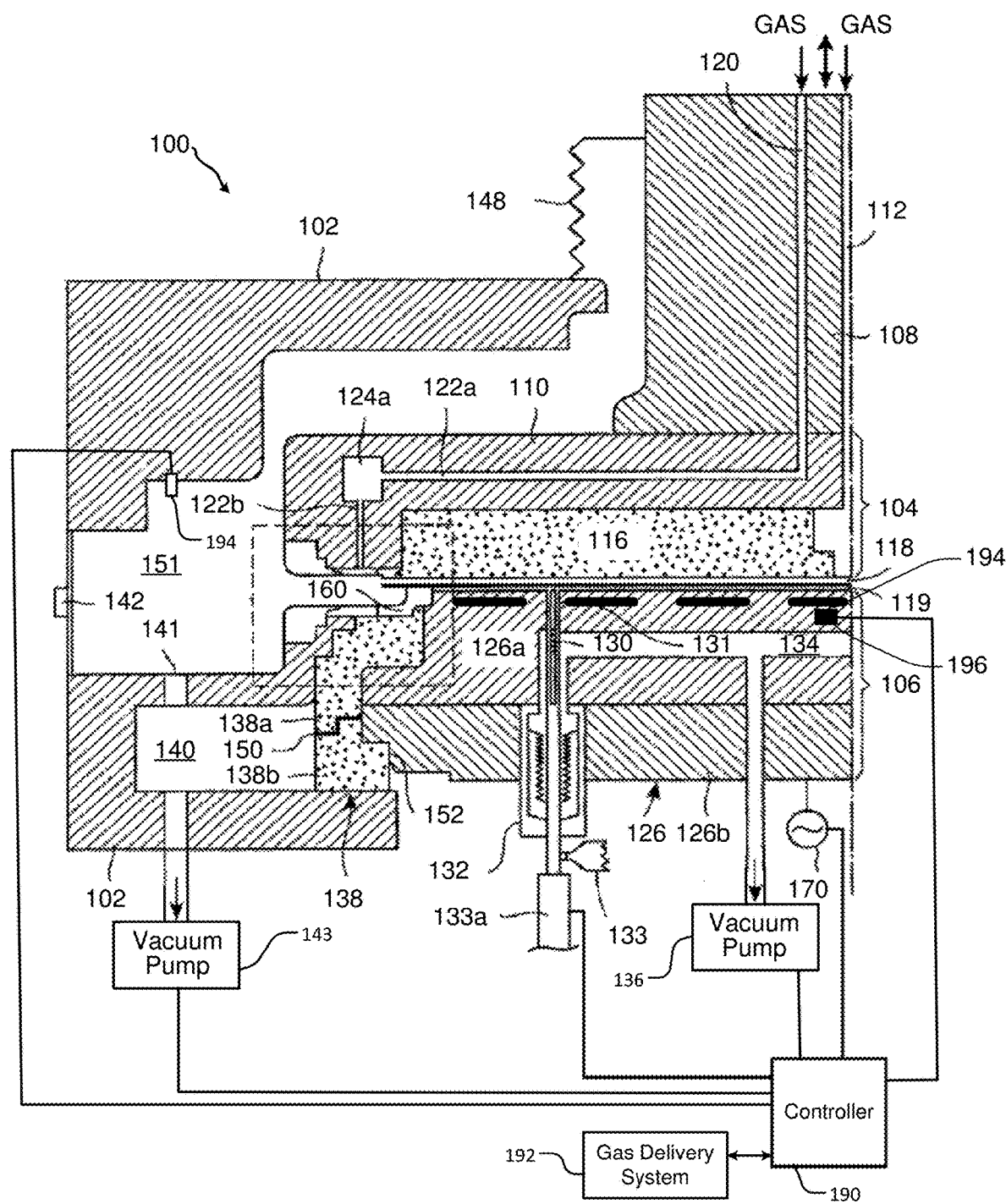
FIG. 1 is a cross-sectional view of a portion of a substrate processing system according to the present disclosure.

Referring now to FIG. 1, a substrate processing system 100 for cleaning a bevel edge of a substrate 118 and/or depositing a thin film on the bevel edge of the substrate 118 is shown. The substrate processing system 100 includes a chamber wall 102 having a gate 142 through which the substrate 118 is loaded/unloaded. An upper electrode assembly 104 is connected to a support 108. The substrate processing system 100 includes a lower electrode assembly 106. A drive system (not shown) is attached to the support 108 for moving the upper electrode assembly 104 up and down (in the direction of the double arrow) to adjust the gap between the upper electrode assembly 104 and the substrate 118.

Metal bellows 148 form a vacuum seal between the chamber wall 102 and support 108 while allowing the support 108 to move vertically relative to the chamber wall 102. The support 108 has a center gas feed (passage) 112 and an edge gas feed (passage) 120. One or both gas feeds 112, 120 can deliver a plasma gas mixture to clean the bevel edge and/or to deposit a thin film thereon.

During operation, the plasma is formed around the bevel edge of the substrate 118 and is generally ring shaped. To prevent the plasma from reaching the central portion of the substrate 118, the space between a dielectric plate 116 on the upper electrode assembly 104 and the substrate 118 is small and the process gas is fed from the center feed. Then, the gas passes through the gap between the upper electrode assembly 104 and the substrate 118 in the radial direction of the substrate.

In some examples, the purge gas is injected through the center gas feed 112, while the process gas is injected through the edge gas feed 120. The plasma/process gas is withdrawn from the chamber space 151 to the bottom space 140 via a plurality of holes (outlets) 141. In some examples, a vacuum pump 143 can be used to evacuate the bottom space 140 during a cleaning operation.

The upper electrode assembly 104 includes the upper dielectric plate 116 and an upper metal component 110 secured to the support 108 by a suitable fastening mechanism and grounded via the support 108. The upper metal component 110 has one or more edge gas passageways or through holes 122a, 122b and an edge gas plenum 124a. The edge gas passageways or through holes 122a, 122b are coupled to the edge gas feed 120 for fluid communication during operation. The upper dielectric plate 116 is attached to the upper metal component 110.

The lower electrode assembly 106 includes powered electrode 126 having an upper portion 126a and a lower portion 126b. A pin operating unit 132 and lift pins 130 move the substrate 118 up and down. A bottom dielectric ring 138 includes an upper portion 138a and a lower portion 138b. In some examples, the chuck includes an electrostatic chuck or a vacuum chuck. Hereinafter, the term powered electrode refers to one or both of the upper and lower portions 126a, 126b. Likewise, the term bottom dielectric ring 138 refers to one or both of the upper and lower portions 138a, 138b. The powered electrode 126 is coupled to a radio frequency (RF) power source 170 to receive RF power during operation.

The lift pins 130 move vertically within cylindrical holes or paths 131 and are moved between upper and lower positions by the pin operating unit 132 positioned in the powered electrode 126. The pin operating unit 132 includes a housing around each lift pin to maintain a vacuum sealed environment around the pins. The pin operating unit 132 includes any suitable lift pin mechanism, such as a robot 133 (e.g., a horizontal arm having segments extending into each housing and attached to each pin) and an arm actuating device (not shown) and with a pin guide assembly 133a.

The substrate 118 is mounted on the lower electrode or on a lower configurable plasma-exclusion-zone (PEZ) ring 160. The term PEZ refers to a radial distance from the center of the substrate to the outer edge of the area where the plasma for cleaning the bevel edge is to be excluded. In an embodiment, the top surface of the powered electrode 126, the bottom surface of the substrate 118, and inner periphery of the lower configurable PEZ ring 160 can form an enclosed vacuum region recess (vacuum region) 119 in fluid communication with a vacuum source such as a vacuum pump 136. The cylindrical holes or paths for the lift pins 130 are also shared as gas passageways, through which the vacuum pump 136 evacuates the vacuum region 119 during operation. The powered electrode 126 includes a plenum 134 to reduce temporal pressure fluctuations in the vacuum region 119. In cases where multiple lift pins are used, the plenum 134 provides a uniform suction rate for the cylindrical holes.

During operation, substrate bowing can be reduced by use of a pressure difference between the top and bottom surfaces of the substrate 118. The pressure in the vacuum region 119 is maintained under vacuum during operation by a vacuum pump 136 coupled to the plenum 134. By adjusting the gap between the upper dielectric plate 116 and the top surface of the substrate 118, the gas pressure in the gap can be varied without changing the overall flow rate of the process gas(es). Thus, by controlling the gas pressure in the gap, the pressure difference between the top and bottom surfaces of the substrate 118 can be varied and thereby the bending force applied on the substrate 118 can be controlled.

In some examples, the lower portion 138b of the bottom dielectric ring has a step 152 formed on the inner periphery of its upper surface to mate with a recess on a lower edge of the powered electrode 126. In some examples, the lower portion 138b has a step 150 formed on its outer periphery to mate with a stepped surface on the upper portion 138a of the bottom dielectric ring, referred to as a focus ring. The steps 150, 152 align the bottom dielectric ring 138 with the powered electrode 126. The step 150 also forms a tortuous gap along the surface thereof to eliminate the direct line-of-sight between the powered electrode 126 and the chamber wall 102 thereby reducing the possibility of a secondary plasma strike between the powered electrode 126 and the chamber wall 102.

A controller 190 controls operation of the substrate processing system 100. The controller operates a gas delivery system 192 to deliver gases to the substrate processing system 100 at the appropriate times during a process. The controller 190 may monitor RF voltage or RF voltage and current via a sensor 196 and controls power supplied by the RF power source 170. The controller 190 controls the vacuum pumps 136 and 143 to control pressure in the substrate processing system.

One or more heaters 194 such as one or more resistive heaters can be used to control a temperature of the substrate support and/or the substrate in one or more zones. One or more temperature sensors 196 can be used to measure temperature in the one or more zones. The controller 190 outputs power to the one or more heaters 194 based on one or more temperature values sensed by the one or more temperature sensors 196 in the one or more zones and based on one or more sets of feedforward values.

Figure 2:
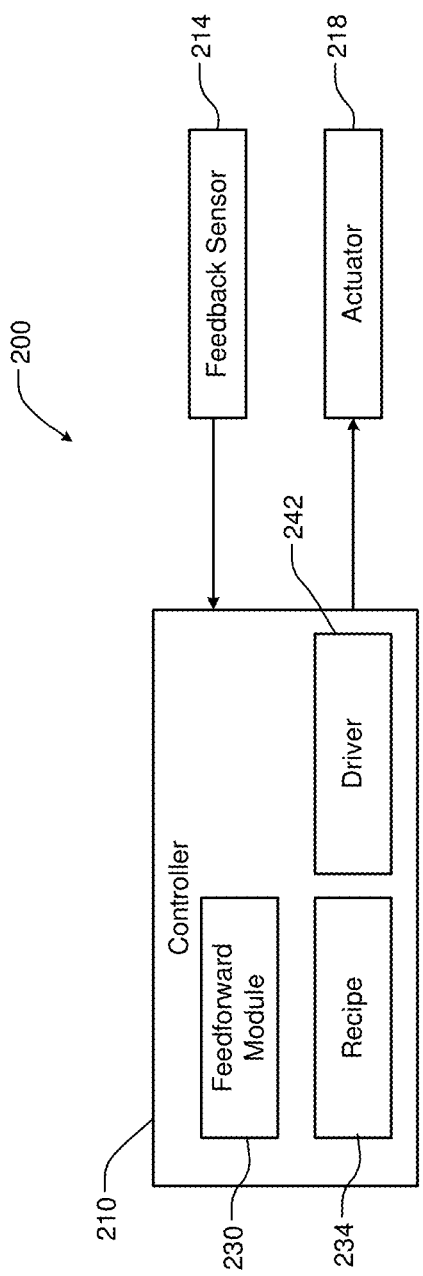
FIG. 2 is a functional block diagram of an example of a feedforward control system for a sensor and an actuator according to the present disclosure.
Figure 3:
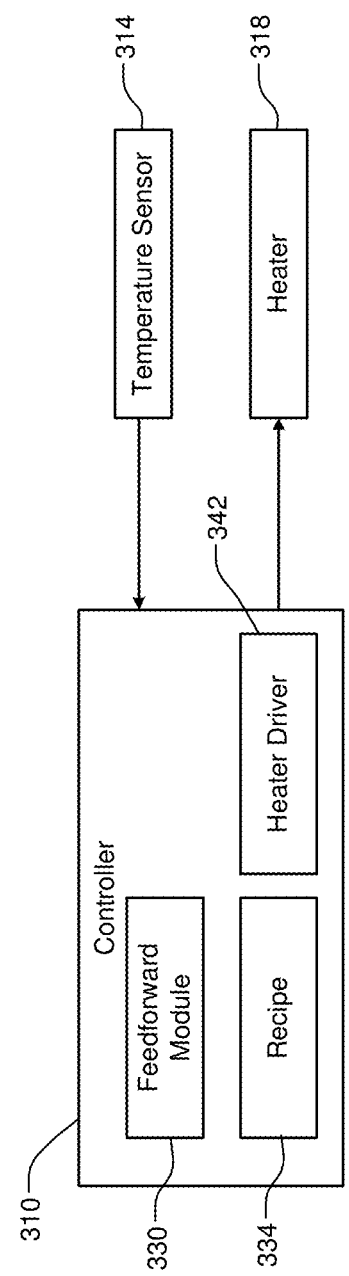
FIG. 3 is a functional block diagram of an example of a feedforward control system for a temperature sensor and a heater according to the present disclosure.

Referring now to FIGS. 2 and 3, examples of feedforward control systems are shown. In FIG. 2, a feedforward control system 200 includes a controller 210, one or more feedback sensors 214 and one or more actuators 218. The controller 210 includes a feedforward module 230, a recipe 234, and one or more drivers 242 for generating control signals for the actuator 218. In some examples when auto-calibrated feedforward is enabled, the controller 210 generates a warning that the first substrate will be used to calibrate the feedforward values. A multi-step recipe is run by the controller 210 using default feedforward values.

A measured parameter (such as temperature, pressure, etc.) is stored as a function of time during processing. After the process recipe is performed, feedforward values are adjusted during each of the steps of the multi-step recipe based upon the measured parameter to create one or more feedforward values. During processing of subsequent substrates, the new feedforward values are used to control the one or more actuators 218. As will be described further below, additional refinement of the feedforward values can be performed during processing of subsequent substrates.

In FIG. 3, a feedforward control system 300 includes a controller 310, one or more temperature sensors 314 and one or more heaters 318. The controller 310 includes a feedforward module 330, a recipe 334, and one or more heater drivers 342 for generating heater control signals.

Figure 4:
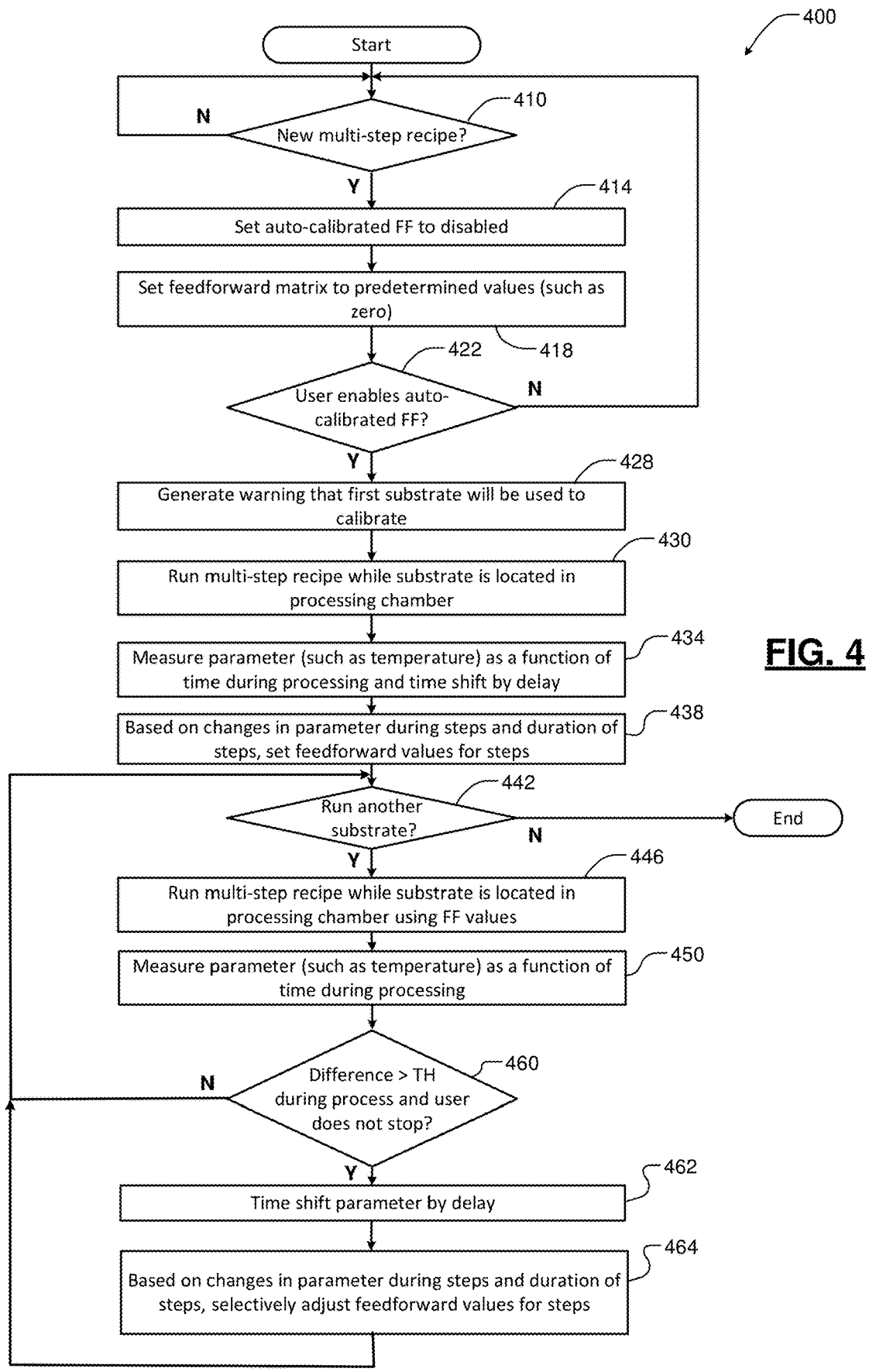
FIG. 4 is a flowchart of an example of a method for providing feedforward control according to the present disclosure.

Referring now to FIG. 4, a method for providing a feedforward control is shown. At 410, the method determines whether a new multi-step recipe is to be performed. When 410 is true, the method sets the auto-calibrated feedforward to be disabled at 414. At 418, the feedforward values are set to predetermined values such as zero.

At 422, the method determines whether the user enables auto calibrated feedforward. When 422 is true, the method optionally generates a warning that the first substrate will be used to calibrate feedforward values at 428. At 430, a multi-step recipe is performed while the substrate is located in the processing chamber. The duty cycle of the heater is stored at predetermined time intervals.

At 434, a parameter such as temperature or another type of parameter is measured as a function of time during processing. At 438, the feedforward values are set during the steps of the multi-step recipe based on changes in the measured parameter during the steps and the duration of the steps. In some examples, the measured parameter is time-shifted relative to the duty cycle values and compared to a desired parameter for the process step and the corresponding feedforward value is adjusted based thereon. In some examples, the parameter is time-shifted by the delay of the system or plant.

At 442, the method determines whether another substrate is to be run. If 442 is true, the method runs the multi-step recipe while the substrate is located in the processing chamber using the auto-calibrated feedforward values. At 450, the parameter is measured as a function of time during processing.

At 460, the method compares a difference between the parameter and a predetermined value to a predetermined threshold. If the difference is greater than the predetermined threshold (or the user does not stop the calibration) as determined at 460, the method time shifts the parameter by the delay at 462. At 464, the feedforward parameters are adjusted based on changes in the parameter during the steps and the duration of the steps.

Figure 5:
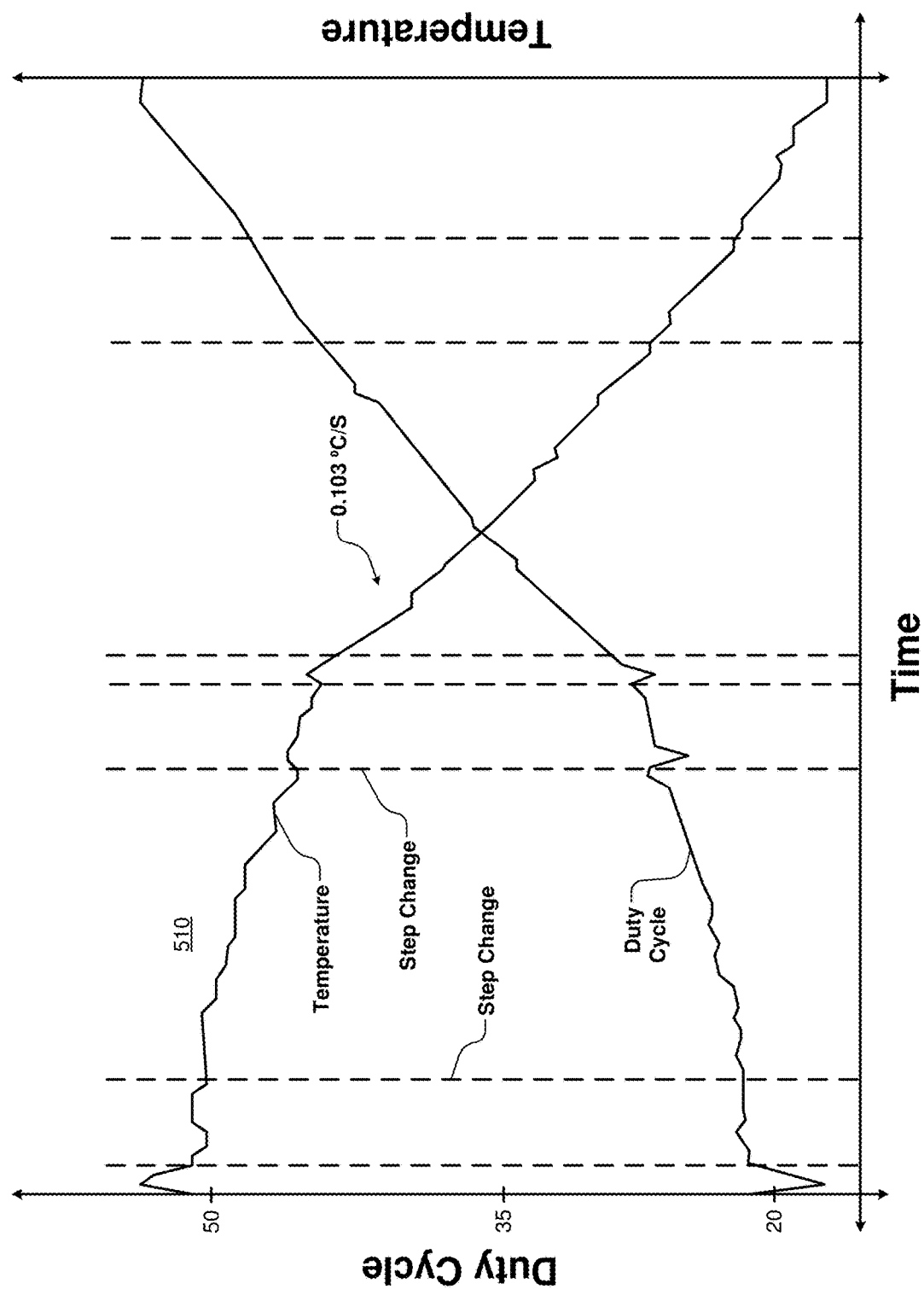
FIG. 5 is a graph illustrating an example of temperature and duty cycle as a function of time for a substrate support according to the prior art.

Referring now to FIG. 5, duty cycle and temperature are shown as a function of time for a substrate processing system without feedforward according to the present disclosure. As was described above, the temperature sensor has a very long thermal delay (such as 50-55 s). For example during a process step 510, the pressure increases and the substrate experiences cooling. The temperature sensor detects the decrease in temperature after a long delay. As a result, the controller increases the duty cycle of the heater too late, the substrate experiences a significant temperature delta. The substrate experiences additional cooling in subsequent steps (along with the sensing delay) and the heater is unable to control the temperature of the substrate in a stable manner during the process.

Figure 6:
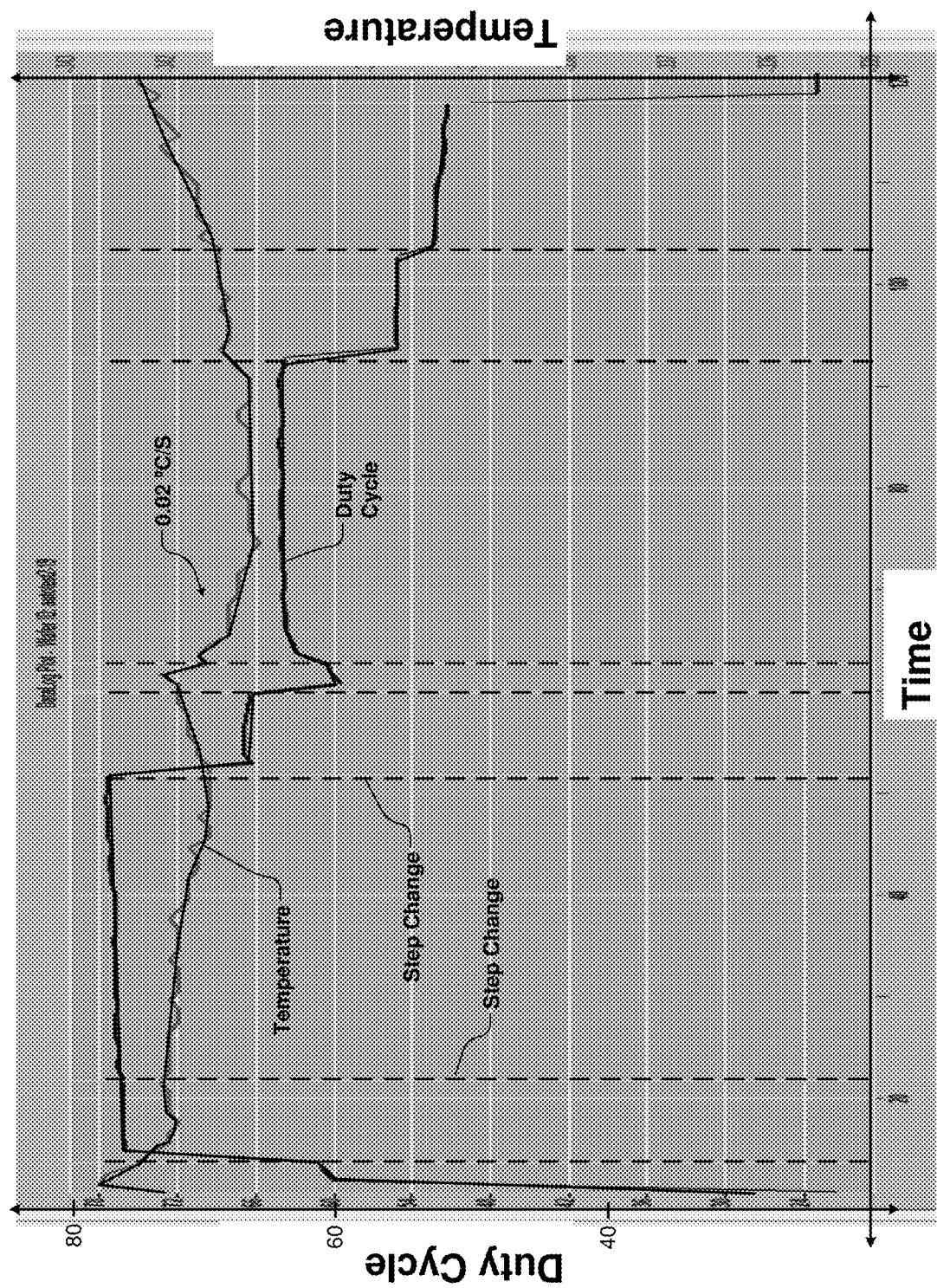
FIG. 6 is a graph illustrating an example of temperature and duty cycle as a function of time for a substrate support according to the present disclosure.

Referring now to FIG. 6, duty cycle and temperature are shown as a function of time for a substrate processing system with feedforward control according to the present disclosure. The controller adjusts the feedforward values based upon measurements made during processing of the first substrate (and additional adjustments thereafter). As a result, the heater is controlled using feedforward control and the temperature of the substrate is maintained in a stable manner.

Figure 7:
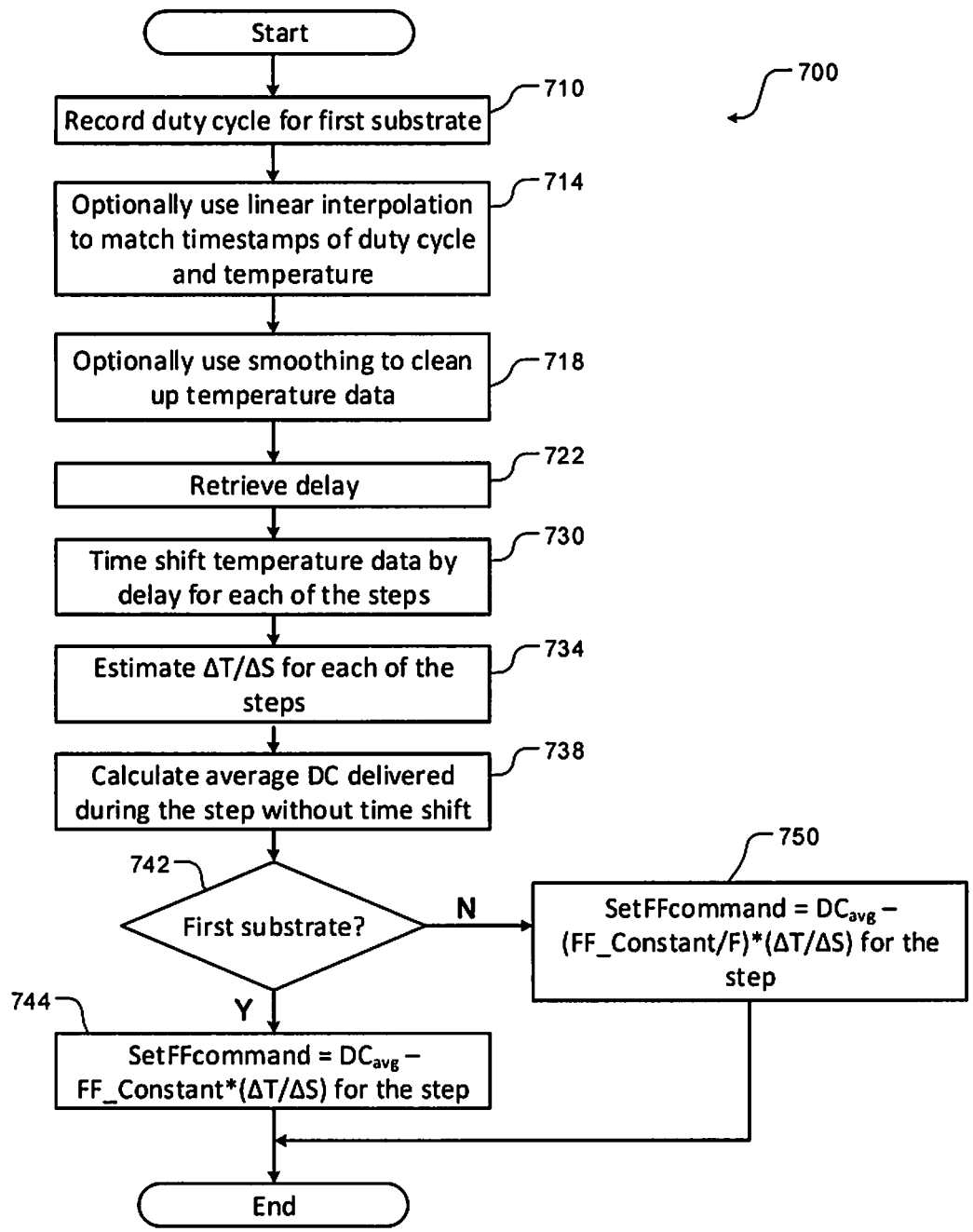
FIG. 7 is a flow chart of an example of a method for determining feedforward values according to the present disclosure.

Referring now to FIG. 7, a method 700 for determining the feedforward values is shown. At 710, a duty cycle is recorded for the first substrate during processing of the substrate. At 714, linear interpolation or other methods may be used to match timestamps of duty cycle and the measured temperature values. At 718, data smoothing or other techniques may be used to clean the temperature data. At 722, the measurement delay of the sensor is retrieved. In some examples, the measurement delay is input by the user. At 730, the temperature data is time shifted by the delay for each of the process steps. At 734, the change in temperature $\Delta T$ is determined during the process step based upon the initial and final temperature values during the process step. The change in time $\Delta S$ is also determined for the process step by subtracting the initial time when the process step started to the final time when the process step ends. At 738, the average duty cycle $DC_{avg}$ that is delivered during the step is determined (without the time shift).

If the substrate that was processed was the first substrate as determined at 742, the feedforward command is set equal to SetFFcommand=$DC_{avg}$-FF_Constant*($\Delta T/\Delta S$) for the step at 744. Otherwise the feedforward command is set equal to SetFFcommand=$DC_{avg}$-(FF_Constant/F)*($\Delta T/\Delta S$) for the process step at 750 where F is a constant that slows calibration of the feedforward values after the initial feedforward values are calculated for the first substrate. In some examples, F is in a range from 1 to 10 although other values may be used. In some examples, F is set to 1 to provide equal weighting to the first and subsequent iterations. The FF_Constant is a value that is determined to allow scaling of the feedforward values for different pedestals. Different pedestals may have different power output levels. As a result, the duty cycle values will vary accordingly. The FF_Constant can be adjusted or scaled to accommodate these differences.

Figure 8:
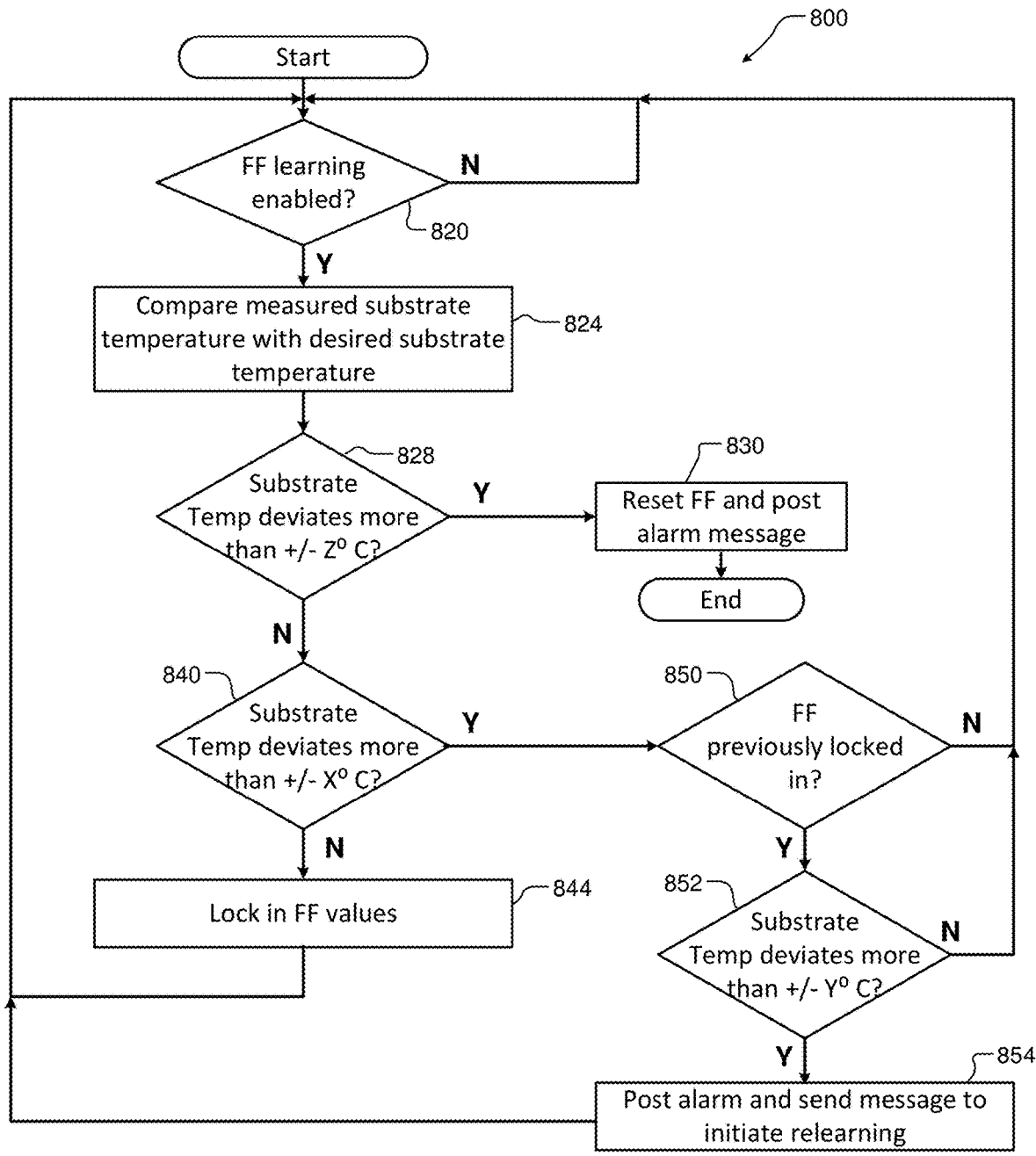
FIG. 8 is a flow chart of an example of a method for locking in feedforward values according to the present disclosure.

Referring now to FIG. 8, a method 800 for adjusting feedforward operation is shown. At 820, the method determines whether feedforward learning is enabled. If 820 is true, the method compares the measured substrate temperature with the desired substrate temperature. At 828, the method determines whether the substrate temperature deviates by more than +/-Z° C. In some examples, Z is equal to 10° C., although other temperature values can be used. If 828 is true, the method resets the feedforward values and transmits an alarm message at 830.

If 828 is false, the method determines whether the substrate temperature deviates by more than +/-X ° C. at 840. In some examples, X is equal to 2° C., although other temperature values can be used. If 840 is false, the FF values are locked in at 844. If 840 is true, the method continues at 850 and determines whether FF values were previously locked in. If 850 is false, the method returns to 820. If 850 is true, the method continues at 852. At 852, the method determines whether the substrate temperature deviates more than +/-Y ° C. In some examples, Y is equal to 5° C., although other temperature values can be used. If 852 is false, the method continues at 820. If 852 is true, the method continues at 854, posts an alarm and sends a message to initiate relearning.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
  a sensor to generate sensed values of a parameter of the substrate processing system;
  an actuator to adjust the parameter of the substrate processing system; and a controller in communication with the sensor and the actuator and configured to
    process a first substrate using the sensed values to adjust control values for controlling the actuator without feedforward control during a process,
    automatically calibrate feedforward values for processing a second substrate based on the sensed values and the control values, wherein the automatic calibration of the feedforward values comprises
        time-shifting the sensed values by a delay period to generate time-shifted sensed values,
        determining changes in the time-shifted sensed values during a plurality of etch or deposition steps of the process,
        determining an average value for one of the control values,
        determining a scaled value based on one of the changes in the time-shifted sensed values and a duration of one of the plurality of etch or deposition steps, and
        determining one of the feedforward values based on a difference between the average value and the scaled value, and
    process the second substrate while controlling the actuator using the feedforward values.

2. The substrate processing system of claim 1, wherein to automatically calibrate the feedforward values, the controller is further configured to:
    determine durations of the plurality of etch or deposition steps of the process, wherein the durations include the duration of the one of the plurality of etch or deposition steps; and
    determine the feedforward values for the plurality of etch or deposition steps of the process based on the duration of the corresponding one of the plurality of etch or deposition steps of the process.

3. The substrate processing system of claim 2, wherein the delay period is longer than 5 seconds.

4. The substrate processing system of claim 2, wherein the controller is further configured to perform data smoothing on the sensed values from the sensor.

5. The substrate processing system of claim 2, wherein the controller is further configured to perform interpolation to match timestamps for the sensed values and the control values.

6. The substrate processing system of claim 2, wherein the controller is further configured to determine average values for the control values during the plurality of etch or deposition steps of the process.

7. The substrate processing system of claim 6, wherein the controller is further configured to determine the feedforward values for the plurality of etch or deposition steps of the process based on the average values, the changes in the sensed values during the plurality of etch or deposition steps of the process, and the duration of the plurality of etch or deposition steps of the process.

8. The substrate processing system of claim 7, wherein the feedforward values for the second substrate are calculated based on $DC_{avg} - FF\_Constant*(\Delta T/\Delta S)$ wherein $DC_{avg}$ corresponds to the average values, $\Delta T$ corresponds to the changes in the sensed values during the plurality of etch or deposition steps of the process, $\Delta S$ corresponds to the duration of the plurality of etch or deposition steps of the process, and FF_Constant corresponds to a scaling factor.

9. The substrate processing system of claim 7, wherein the feedforward values for a third substrate are calculated based on $DC_{avg} - FF\_Constant/K*(\Delta T/\Delta S)$ wherein $DC_{avg}$ corresponds to the average values, $\Delta T$ corresponds to the changes in the sensed values during the plurality of etch or deposition steps of the process, $\Delta S$ corresponds to the duration of the plurality of etch or deposition steps of the process, FF_Constant corresponds to a scaling factor, and K is a calibration reducing factor.

10. The substrate processing system of claim 1, wherein the sensor includes a temperature sensor.

11. The substrate processing system of claim 10, wherein the actuator includes a heater for a substrate support of the substrate processing system.

12. The substrate processing system of claim 11, wherein the control values include duty cycle values.

13. The substrate processing system of claim 1, wherein the substrate processing system performs at least one of deposition and etching.

14. The substrate processing system of claim 1, wherein the controller is configured to, while automatically calibrating the feedforward values:
    determine whether a temperature of the first substrate deviates more than a predetermined threshold; and
    in response to the temperature of the first substrate deviating more than the predetermined threshold, resetting the feedforward values.

15. The substrate processing system of claim 1, wherein the controller is configured to, while automatically calibrating the feedforward values:
    determine whether a temperature of the first substrate deviates more than a first predetermined threshold;
    in response to the temperature of the first substrate not deviating more than the first predetermined threshold, determine whether the temperature of the first substrate deviates more than the second predetermined threshold; and
    in response to the temperature of the first substrate not deviating more than a second predetermined threshold, locking in the feedforward values.

16. The substrate processing system of claim 15, wherein the controller is configured to, while automatically calibrating the feedforward values:
    in response to the temperature of the first substrate deviating more than a second predetermined threshold, determining whether the feedforward values were previously locked in;
    in response to the feedforward values being previously locked in, determining whether the temperature of the first substrate has deviated more than a third predetermined threshold; and
    in response to the temperature of the first substrate deviating more than the third predetermined threshold, initiate relearning of the feedforward values.

17. A method for processing a substrate in a substrate processing system, comprising:
    generating sensed values of a parameter of the substrate processing system;
    adjusting the parameter of the substrate processing system;
    processing a first substrate using the sensed values to adjust control values for controlling an actuator without feedforward control during a process;
    automatically calibrating feedforward values for processing a second substrate based on the sensed values and the control values, wherein the automatic calibration of the feedforward values comprises at least one of
        (i) time-shift the sensed values by a delay period to generate time-shifted sensed values and determine changes in the time-shifted sensed values during a plurality of etch or deposition steps of the process, and determine the feedforward values for the plurality of etch or deposition steps of the process based on the change in sensed values during a corresponding one of the plurality of etch or deposition steps, or (ii) determine durations of the plurality of etch or deposition steps of the process, and determine the feedforward values for the plurality of etch or deposition steps of the process based on the duration of a corresponding one of the plurality of etch or deposition steps, wherein the automatic calibration of the feedforward values comprises determining an average value for one of the control values, determining a scaled value based on a change in one of the sensed values and a duration of one of the plurality of etch or deposition steps, and determining one of the feedforward values based on a difference between the average value and the scaled value; and processing the second substrate while controlling the actuator using the feedforward values.

18. The method of claim 17, wherein automatically calibrating the feedforward values includes:

time-shifting the sensed values by the delay period to generate the time-shifted sensed values;

determining changes in the time-shifted sensed values during the plurality of etch or deposition steps of the process;

determining the durations of the plurality of etch or deposition steps of the process;

determining the feedforward values for the plurality of etch or deposition steps of the process based on the control values for the actuator, the change in the sensed values during the corresponding one of the plurality of etch or deposition steps and the duration of the corresponding one of the plurality of etch or deposition steps of the process; and processing the second substrate based on the feedforward values.

19. The method of claim 18, further comprising performing data smoothing on the sensed values from a sensor.

20. The method of claim 19, further comprising performing interpolation to match timestamps for the sensed values and the control values.

21. The method of claim 17, further comprising determining average values for the control values during the plurality of etch or deposition steps of the process.

22. The method of claim 21, further comprising determining the feedforward values for the plurality of etch or deposition steps of the process based on the average values, the changes in the sensed values during the plurality of etch or deposition steps of the process, and the duration of the plurality of etch or deposition steps of the process.

23. The method of claim 22, further comprising calculating the feedforward values for the second substrate based on $DC_{avg} - FF\_Constant*(\Delta T/\Delta S)$ wherein $DC_{avg}$ corresponds to the average values, $\Delta T$ corresponds to the changes in the sensed values during the plurality of etch or deposition steps of the process, $\Delta S$ corresponds to the duration of the plurality of etch or deposition steps of the process, and FF_Constant corresponds to a scaling factor.

24. The method of claim 17, wherein the control values include duty cycle values.

25. A substrate processing system to process a substrate, comprising:

a sensor to generate sensed values of a parameter of the substrate processing system;

an actuator to adjust the parameter of the substrate processing system; and a controller in communication with the sensor and the actuator and configured to process a first substrate using the sensed values to adjust control values for controlling the actuator without feedforward control during a process, automatically calibrate feedforward values for processing a second substrate based on the sensed values and the control values, wherein the automatic calibration of the feedforward values comprises determining an average value for one of the control values, determining a scaled value based on a change in one of the sensed values and a duration of an etch or deposition step, and determining one of the feedforward values based on a difference between the average value and the scaled value, and process the second substrate while controlling the actuator using the feedforward values.

* * * * *